(12) United States Patent
Tang

(10) Patent No.: US 9,897,912 B2
(45) Date of Patent: Feb. 20, 2018

(54) COLOR FILTER FILM MANUFACTURING METHOD AND COLOR FILTER FILM

(71) Applicant: Shenzhen China Star Optoelectronics Technology Co., Ltd., Shenzhen (CN)

(72) Inventor: Min Tang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 182 days.

(21) Appl. No.: 14/908,549

(22) PCT Filed: Dec. 23, 2015

(86) PCT No.: PCT/CN2015/098501
§ 371 (c)(1),
(2) Date: Jan. 29, 2016

(87) PCT Pub. No.: WO2017/080025
PCT Pub. Date: May 18, 2017

(65) Prior Publication Data
US 2017/0261848 A1    Sep. 14, 2017

(30) Foreign Application Priority Data

Nov. 13, 2015  (CN) .......................... 2015 1 0779603

(51) Int. Cl.
G02B 5/20      (2006.01)
G03F 7/00      (2006.01)

(52) U.S. Cl.
CPC .......... *G03F 7/0007* (2013.01); *G02B 5/201* (2013.01); *G02B 5/206* (2013.01); *G02B 5/207* (2013.01)

(58) Field of Classification Search
CPC ....... G03F 7/0007; G02B 5/201; G02B 5/206; G02B 5/207; G02B 5/223; G02F 1/133514; G02F 1/133516
(Continued)

(56) References Cited

U.S. PATENT DOCUMENTS 5,439,582 A * 8/1995 Oka ................ G02B 5/201
205/135
2008/0299327 A1* 12/2008 Salleo ................ G02B 5/201
427/595

(Continued)

FOREIGN PATENT DOCUMENTS

| CN | 102713730 A | 10/2012 |
| CN | 203337949 U | 12/2013 |
| CN | 104835783 A | 8/2015 |

*Primary Examiner* — John A McPherson
(74) *Attorney, Agent, or Firm* — Leong C. Lei

(57) ABSTRACT

The present invention provides a color filter film manufacturing method and a color filer film. The color filter film manufacturing method of the present invention includes forming transparent photoresist layers in blue sub-pixel zones and forming first and second recesses respectively in red and green sub-pixel zones and subjecting bottoms thereof to a treatment for hydrophilicity/hydrophobicity. The difference of hydrophilicity/hydrophobicity between the bottoms of the first and second recesses and a surface of the photoresist layer, in combination with altitude differences, makes the red and green quantum dot materials to respectively form red and green quantum dot layers in the first and second recesses through autonomous flowing. The red and green quantum dot layers are excited by blue backlight source to respectively emit red light and green light, while the blue backlight source directly transmits through the transparent photoresist layers to give off blue light thereby providing three primary colors of red, green, and blue to achieve color displaying, increasing utilization of quantum (Continued)

dots, the effect of autonomous flowing of the quantum dot paste being made better for higher resolution and denser arrangement of pixels, and thus, making it better suitable for manufacture of high-resolution panels than ink-jet printing techniques.

13 Claims, 7 Drawing Sheets

(58) Field of Classification Search
USPC .............................................. 430/7; 349/106
See application file for complete search history.

(56) References Cited

U.S. PATENT DOCUMENTS

2013/0242228 A1\* 9/2013 Park .................. G02F 1/133617
349/61
2017/0176863 A1\* 6/2017 Zhang ....................... G03F 7/40

\* cited by examiner

COLOR FILTER FILM MANUFACTURING METHOD AND COLOR FILTER FILM

BACKGROUND OF THE INVENTION

1. Field of the Invention

The present invention relates to the field of display technology, and in particular to a color filter film manufacturing method and a color filter film.

2. The Related Arts

Recently, with the progress of science and technology, the techniques of liquid crystal display have been continuously improved. Thin-film transistor liquid crystal displays (TFT-LCDs) take an important position among the display devices, due to quality of image displaying, low power consumption, and environmental friendliness, but the color displayed cannot cover the complete range of color gamut. Organic light-emitting diode (OLED) based display techniques that have emerged recently but are getting mature also have simple structures, reduced thickness, fast response, and capable of displaying richer colors. Further, with the advent of quantum dots, quantum dot displays have also been emerging. Since quantum dots have very narrow wavelength ranges of emission light so that the color purity is extremely high and allows for fine tuning. Compared to the conventional display monitors, newly-developed display monitors could greatly increase brightness and vividness of image and at the same time, help reduce power consumption.

Quantum dots, also referred to as nanometer crystals, are nanometer particles formed of elements of II-VI group or III-V group. The particle size of the quantum dots is generally between 1-20 nm. Due to quantum confinement of electrons and holes, a continuous energy band structure is changed into a discrete energy level structure exhibiting molecular characteristics. Thus, quantum dots, when excited by blue-violet light, are converted into monochromic light having high purity, making it possible to control color by means of the diameter of the quantum dots, and, when applied to panel display techniques, can effectively improve color gamut of a panel, providing restoration of true colors.

Nowadays, the quantum dots have been widely used in panel displaying techniques to improve the color gamut of a displaying panel. One of the main trends is to mix quantum dots with a photoresist paste to make a novel color filter film. However, the quantum dots have a high price and the cost of applying the existing photolithographic techniques to the manufacture of quantum dot color filter film is extremely high because the utilization of the quantum dots is low and quantum dots losing the capability of light conversion resulting from being easily damaged by photo initiators. Thus, the one that is considered the most feasible technique of a quantum dot color filter film is ink-jet printing (IJP) techniques. However, the ink-jet printing is constrained for being hard to manufacturing high-resolution products. On the other hand, there is a strong demand for high resolution in the market of small- to medium-sized panels.

Thus it is desired to provide a color filter film manufacturing method of a color filter film to overcome the problem that the ink-jet printing is hard to achieve high resolution.

SUMMARY OF THE INVENTION

An object of the present invention is to provide a color filter film manufacturing method, which makes use of the differences of surface hydrophilicity/hydrophobicity among different materials, in combination with altitude difference, to allow quantum dot paste to undergo autonomous flowing to form quantum dot layers in corresponding sub-pixel zones, in order to adapt to the manufacture of a high-resolution panel.

Another object of the present invention is to provide a color filter film, which comprises red, green, and blue sub-pixel zones in which red quantum dot layers, green quantum dot layers, and transparent photoresist layers are respectively arranged so as to achieve an excellent effect of color displaying and a high resolution.

To achieve the above objects, the present invention provides a color filter film manufacturing method, which comprises the following steps:

(1) providing a base plate and forming a black matrix on the base plate such that the black matrix defines and circumferentially surrounds a plurality of red sub-pixel zones, a plurality of green sub-pixel zones, and a plurality of blue sub-pixel zones on the base plate; and forming transparent photoresist layers in the blue sub-pixel zones;

(2) coating a photoresist layer on the base plate, the black matrix, and the transparent photoresist layers and forming first recesses in the photoresist layer to correspond to the red sub-pixel zones; and subjecting bottoms of the first recesses to a treatment for hydrophilicity/hydrophobicity so as to be opposite to hydrophilicity/hydrophobicity of a surface of the photoresist layer;

(3) coating a red quantum dot material on the photoresist layer with the red quantum dot material having hydrophilicity/hydrophobicity consistent with hydrophilicity/hydrophobicity of the bottoms of the first recesses to allow the red quantum dot material to autonomously flow from the surface of the photoresist layer to the bottoms of the first recesses and then allowing the red quantum dot material to cure so as to form red quantum dot layers in the red sub-pixel zones;

(4) forming second recesses in the photoresist layer to correspond to the green sub-pixel zones and subjecting bottoms of the second recesses to a treatment for hydrophilicity/hydrophobicity so as to be opposite to hydrophilicity/hydrophobicity of the surface of the photoresist layer;

(5) coating a green quantum dot material on the photoresist layer with the green quantum dot material having hydrophilicity/hydrophobicity consistent with hydrophilicity/hydrophobicity of the bottoms of the second recesses to allow the green quantum dot material to autonomously flow from the surface of the photoresist layer to the bottoms of the second recesses and then allowing the green quantum dot material to cure so as to form green quantum dot layers in the green sub-pixel zones; and (6) subjecting a surface of the base plate to ultraviolet irradiation and development to remove a remaining portion of the photoresist layer so as to complete the manufacture of a color filer film;

wherein the red quantum dot layers and the green quantum dot layers are excited by the blue backlight source to respectively give off red light and green light and the blue backlight source transmits directly through the transparent photoresist layers to emit blue light so as to provide three primary colors of red, green, and blue to achieve color displaying.

In step (1), the black matrix is formed by coating a black matrix material on the base plate and applying exposure and development operations thereto and the black matrix material comprises negative photoresist and a black light-shielding material.

In step (2), the photoresist layer comprises positive photoresist.

In step (2), a first mask is used to subject portions of the photoresist layer within the red sub-pixel zones to ultraviolet irradiation and development so as to form the first recesses; and in step (4), a second mask is used to subject portions of the photoresist layer within the green sub-pixel zones to ultraviolet irradiation and development so as to form the second recesses.

In step (3) and step (5), a thermal process is applied to have the red quantum dot material and the green quantum dot material cured.

The thermal process is conducted at a temperature of 60° C.-100° C.

In step (2), the bottoms of the first recesses are subjected to a hydrophilicity treatment and the surface of the photoresist layer is hydrophobic; in step (3), the red quantum dot material is hydrophilic; in step (4), the bottoms of the second recesses are subjected to a hydrophilicity treatment; and in step (5), the green quantum dot material is hydrophilic.

In step (2), the bottoms of the first recesses are subjected to a hydrophobicity treatment and the surface of the photoresist is hydrophilic; in step (3), the red quantum dot material is hydrophobic; in step (4), the bottoms of the second recesses are subjected to a hydrophobicity treatment; and in step (5), the green quantum dot material is hydrophobic.

The base plate comprises a glass plate.

The present invention also provides a color filer film, which comprises a base plate, a black matrix arranged on the base plate, and a plurality of transparent photoresist layers, a plurality of red quantum dot layers, and a plurality of green quantum dot layers arranged on the base plate and are spaced from each other by the black matrix, wherein the red quantum dot layers are formed of a material comprising a mixture of red quantum dots and a paste; and the green quantum dot layers are formed of a material comprising a mixture of green quantum dots and a paste; and the color filer film is operable in combination with a blue backlight source such that the red quantum dot layers and the green quantum dot layers are excitable by the blue backlight source to respectively give off red light and green light, and the blue backlight source is allowed to directly transmit through the transparent photoresist layers to give off blue light thereby providing three primary colors of red, green, and blue to achieve color displaying.

The present invention further provides a color filter film manufacturing method, which comprises the following steps:

(1) providing a base plate and forming a black matrix on the base plate such that the black matrix defines and circumferentially surrounds a plurality of red sub-pixel zones, a plurality of green sub-pixel zones, and a plurality of blue sub-pixel zones on the base plate; and forming transparent photoresist layers in the blue sub-pixel zones;

(2) coating a photoresist layer on the base plate, the black matrix, and the transparent photoresist layers and forming first recesses in the photoresist layer to correspond to the red sub-pixel zones; and subjecting bottoms of the first recesses to a treatment for hydrophilicity/ hydrophobicity so as to be opposite to hydrophilicity/ hydrophobicity of a surface of the photoresist layer;

(3) coating a red quantum dot material on the photoresist layer with the red quantum dot material having hydrophilicity/hydrophobicity consistent with hydrophilicity/hydrophobicity of the bottoms of the first recesses to allow the red quantum dot material to autonomously flow from the surface of the photoresist layer to the bottoms of the first recesses and then allowing the red quantum dot material to cure so as to form red quantum dot layers in the red sub-pixel zones;

(4) forming second recesses in the photoresist layer to correspond to the green sub-pixel zones and subjecting bottoms of the second recesses to a treatment for hydrophilicity/hydrophobicity so as to be opposite to hydrophilicity/hydrophobicity of the surface of the photoresist layer;

(5) coating a green quantum dot material on the photoresist layer with the green quantum dot material having hydrophilicity/hydrophobicity consistent with hydrophilicity/hydrophobicity of the bottoms of the second recesses to allow the green quantum dot material to autonomously flow from the surface of the photoresist layer to the bottoms of the second recesses and then allowing the green quantum dot material to cure so as to form green quantum dot layers in the green sub-pixel zones; and (6) subjecting a surface of the base plate to ultraviolet irradiation and development to remove a remaining portion of the photoresist layer so as to complete the manufacture of a color filer film;

wherein the red quantum dot layers and the green quantum dot layers are excited by the blue backlight source to respectively give off red light and green light and the blue backlight source transmits directly through the transparent photoresist layers to emit blue light so as to provide three primary colors of red, green, and blue to achieve color displaying;

wherein in step (1), the black matrix is formed by coating a black matrix material on the base plate and applying exposure and development operations thereto and the black matrix material comprises negative photoresist and a black light-shielding material;

wherein in step (2), the photoresist layer comprises positive photoresist;

wherein in step (2), a first mask is used to subject portions of the photoresist layer within the red sub-pixel zones to ultraviolet irradiation and development so as to form the first recesses; and in step (4), a second mask is used to subject portions of the photoresist layer within the green sub-pixel zones to ultraviolet irradiation and development so as to form the second recesses;

wherein in step (3) and step (5), a thermal process is applied to have the red quantum dot material and the green quantum dot material cured; and wherein the base plate comprises a glass plate.

The efficacy of the present invention is that the present invention provides a color filter film manufacturing method, which comprises forming transparent photoresist layers in blue sub-pixel zones and forming first and second recesses respectively in red and green sub-pixel zones and subjecting bottoms thereof to a treatment for hydrophilicity/hydrophobicity. The difference of hydrophilicity/hydrophobicity between the bottoms of the first and second recesses and a surface of the photoresist layer, in combination with altitude differences, makes the red and green quantum dot materials to respectively form red and green quantum dot layers in the first and second recesses through autonomous flowing. The red and green quantum dot layers are excited by blue backlight source to respectively emit red light and green light, while the blue backlight source directly transmits through the transparent photoresist layers to give off blue light thereby providing three primary colors of red, green, and blue to achieve color displaying, increasing utilization of quantum dots, the effect of autonomous flowing of the quantum dot paste being made better for higher resolution and denser arrangement of pixels, and thus, making it better suitable for manufacture of high-resolution panels than ink-jet printing techniques. The color filer film of the present invention provides an excellent effect of color displaying and high resolution.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings:

FIGS. 12 and 13 are also schematic views illustrating the structure of a color filter film according to the present invention.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
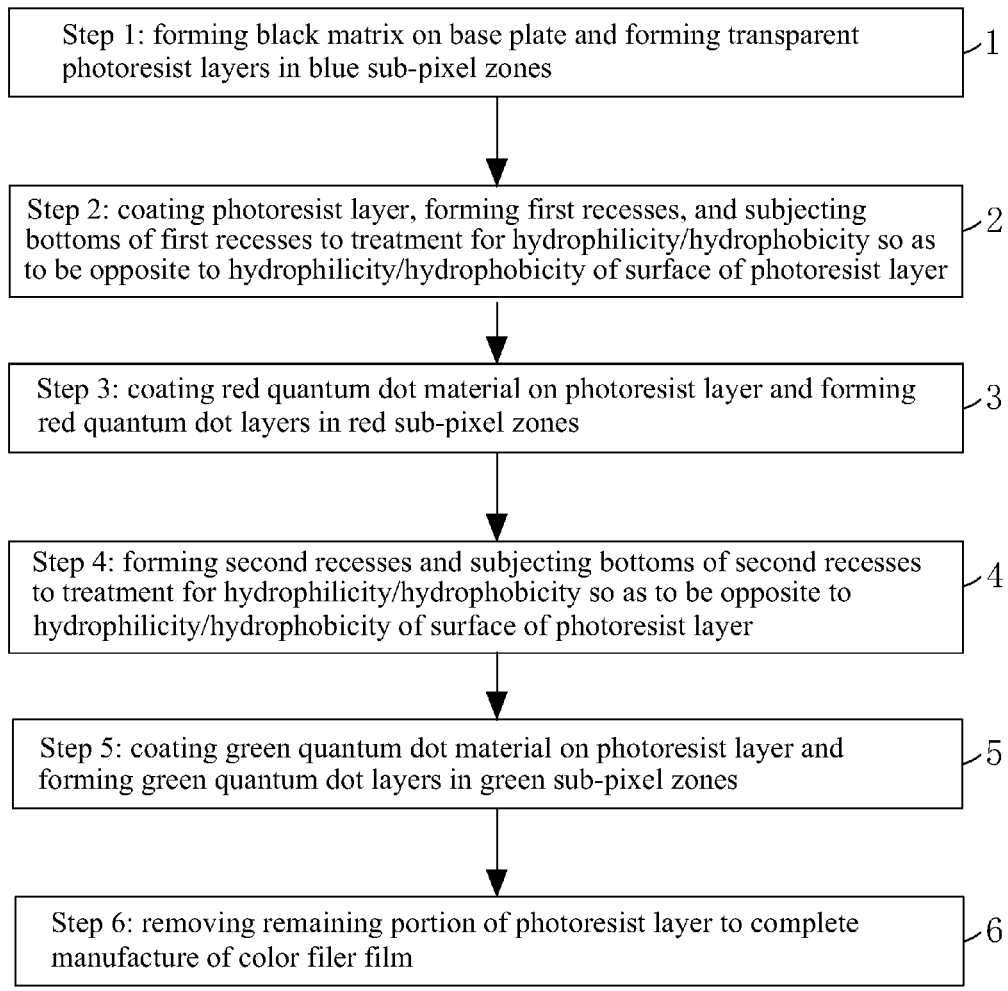
FIG. 1 is a flow chart illustrating a color filter film manufacturing method according to the present invention.
Figure 2:
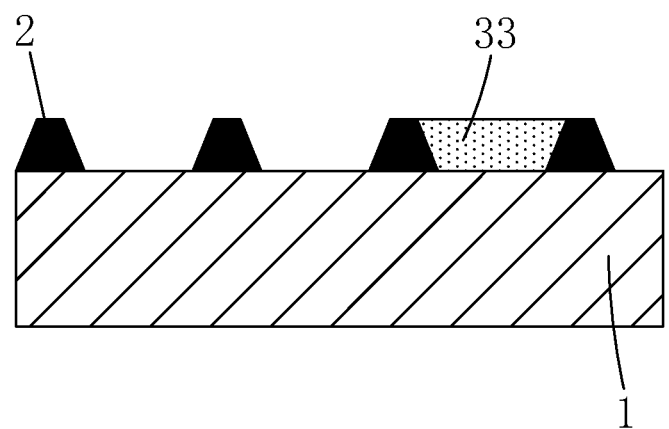
FIG. 2 is a schematic view illustrating step 1 of the color filter film manufacturing method according to the present invention.

Referring to FIG. 1, firstly, the present invention provides a color filter film manufacturing method, which comprises the following steps:

Step 1: as shown in FIG. 2, providing a base plate 1 and forming a black matrix 2 on the base plate 1 such that the black matrix 2 defines and circumferentially surrounds a plurality of red sub-pixel zones, a plurality of green sub-pixel zones, and a plurality of blue sub-pixel zones on the base plate 1; and forming transparent photoresist layers 33 in the blue sub-pixel zones.

Specifically, the base plate 1 comprises a glass plate.

Specifically, the black matrix 2 is formed by coating a black matrix material on the base plate 1 and applying exposure and development operations thereto. Specifically, the black matrix material comprises negative photoresist and a black light-shielding material.

Specifically, the transparent photoresist layers 33 are formed in the blue sub-pixel zones by coating a transparent photoresist material on the base plate 1 that comprises the black matrix 2 formed thereon and applying exposure and development operations thereto.

Figure 3:
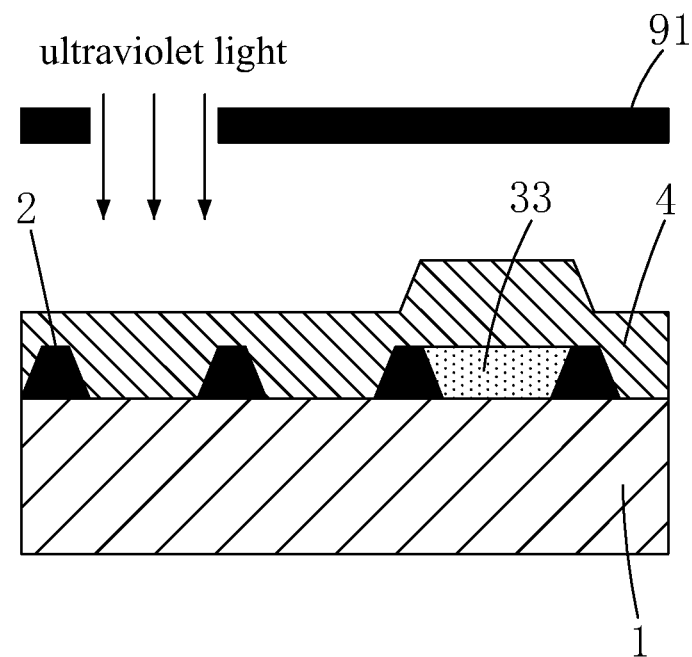
FIGS. 3-4 are schematic views illustrating step 2 of the color filter film manufacturing method according to the present invention.
Figure 4:
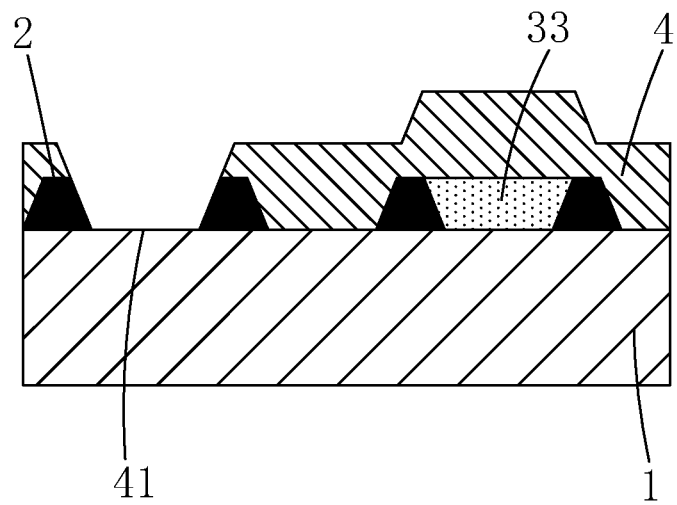

Step 2: as shown in FIGS. 3-4, coating a photoresist layer 4 on the base plate 1, the black matrix 2, and the transparent photoresist layers 33 and forming first recesses 41 in the photoresist layer 4 to correspond to the red sub-pixel zones; and subjecting bottoms of the first recesses 41 to a treatment for hydrophilicity/hydrophobicity so as to be opposite to hydrophilicity/hydrophobicity of a surface of the photoresist layer 4.

Specifically, the photoresist layer 4 comprises positive photoresist. In the instant embodiment, the bottoms of the first recesses 41 are subjected to a hydrophilicity treatment, and the surface of the photoresist layer 4 is hydrophobic.

Specifically, hydrophilicity/hydrophobicity of the surface of the photoresist layer 4 is determined by inherent property of the material of the photoresist layer, or is acquired through a treatment for hydrophilicity/hydrophobicity.

Specifically, a first mask 91 is used to subject the portions of the photoresist layer 4 within the red sub-pixel zones to ultraviolet irradiation and development so as to form the first recesses 41.

Figure 5:
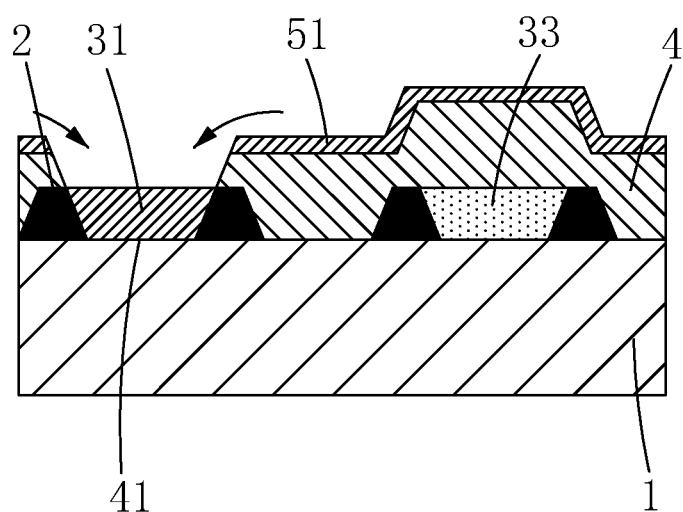
FIGS. 5-6 are schematic views illustrating step 3 of the color filter film manufacturing method according to the present invention.
Figure 6:
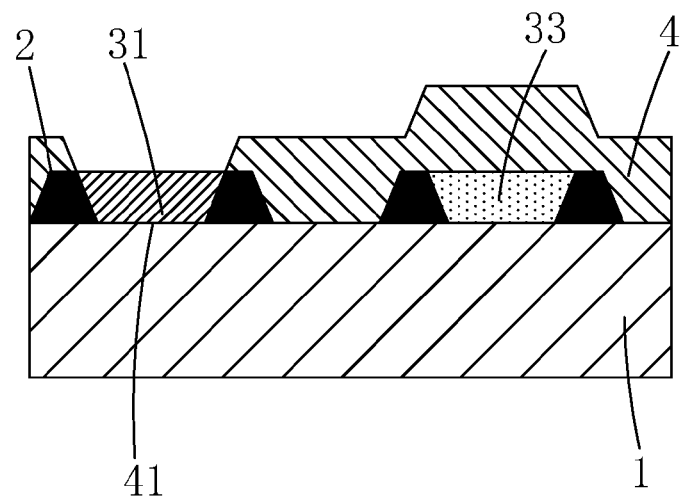

Step 3: as shown in FIGS. 5-6, coating a red quantum dot material 51 on the photoresist layer 4 with the red quantum dot material 51 having hydrophilicity/hydrophobicity consistent with hydrophilicity/hydrophobicity of the bottoms of the first recesses 41 to allow the red quantum dot material 51 to autonomously flow from the surface of the photoresist layer 4 to the bottoms of the first recesses 41 and then allowing the red quantum dot material 51 to cure so as to form red quantum dot layers 31 in the red sub-pixel zones. In the instant embodiment, the red quantum dot material 51 is hydrophilic.

Specifically, the red quantum dot material 51 is a mixture of red quantum dots and a paste. The paste has hydrophilicity/hydrophobicity that is consistent with hydrophilicity/hydrophobicity of the bottoms of the first recesses 41 and opposite to hydrophilicity/hydrophobicity of the surface of the photoresist layer 4.

Specifically, a thermal process is applied to have the red quantum dot material 51 and the green quantum dot material 52 cured. Specifically, the thermal process is conducted at a temperature of 60° C.-100° C.

Figure 7:
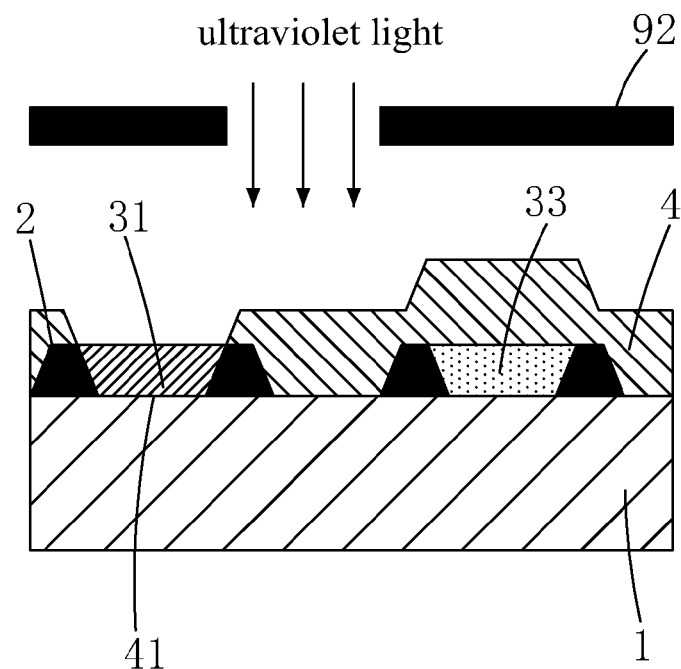
FIGS. 7-8 are schematic views illustrating step 4 of the color filter film manufacturing method according to the present invention.
Figure 8:
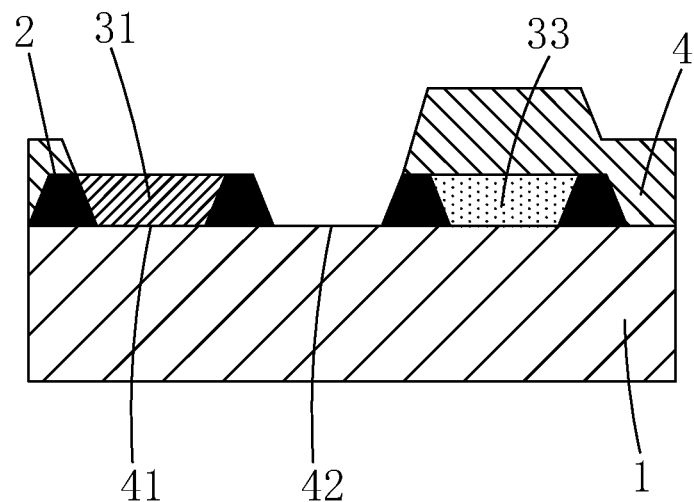

Step 4: as shown in FIGS. 7-8, forming second recesses 42 in the photoresist layer 4 to correspond to the green sub-pixel zones and subjecting bottoms of the second recesses 42 to a treatment for hydrophilicity/hydrophobicity so as to be opposite to hydrophilicity/hydrophobicity of the surface of the photoresist layer 4. In the instant embodiment, the bottoms of the second recesses 42 are subjected to a hydrophilicity treatment.

Specifically, a second mask 92 is used to subject the portions of the photoresist layer 4 within the green sub-pixel zones to ultraviolet irradiation and development so as to form the second recesses 42.

Figure 9:
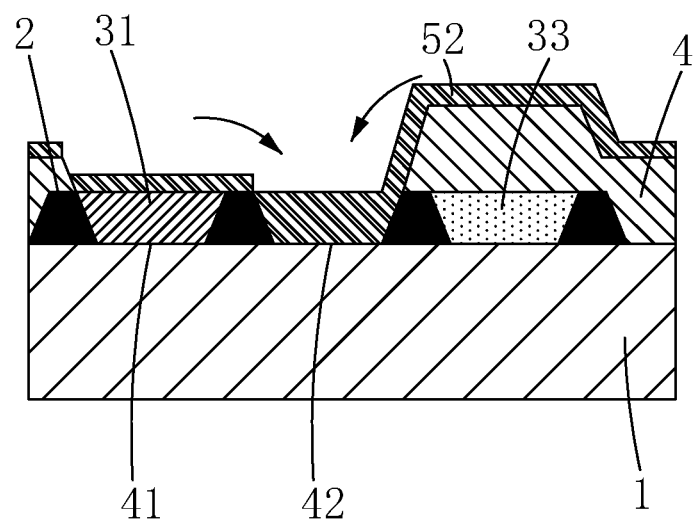
FIGS. 9-10 are schematic views illustrating step 5 of the color filter film manufacturing method according to the present invention.
Figure 10:
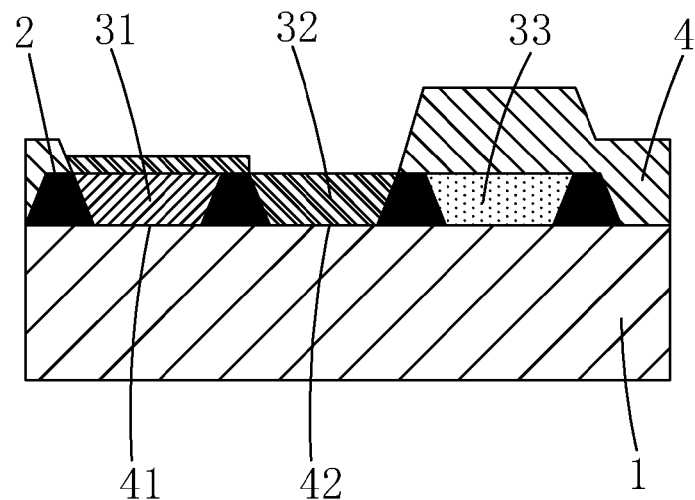

Step 5: as shown in FIGS. 9-10, coating a green quantum dot material 52 on the photoresist layer 4 with the green quantum dot material 52 having hydrophilicity/hydrophobicity consistent with hydrophilicity/hydrophobicity of the bottoms of the second recesses 42 to allow the green quantum dot material 52 to autonomously flow from the surface of the photoresist layer 4 to the bottoms of the second recesses 42 and then allowing the green quantum dot material 52 to cure so as to form green quantum dot layers 32 in the green sub-pixel zones. In the instant embodiment, the green quantum dot material 52 is hydrophilic.

Specifically, the green quantum dot material 52 is a mixture of green quantum dots and a paste. The paste has hydrophilicity/hydrophobicity that is consistent with hydrophilicity/hydrophobicity of the bottoms of the second recesses 42 and opposite to hydrophilicity/hydrophobicity of the surface of the photoresist layer 4.

Specifically, a thermal process is applied to have the red quantum dot material 51 and the green quantum dot material 52 cured. Specifically, the thermal process is conducted at a temperature of 60° C.-100° C.

Specifically, as shown in FIGS. 9-10, after the operation of Step 5, a thin layer of the green quantum dot material may be left on the red quantum dot layers 31 so that backlighting, when getting into the thin layer of green quantum dot material, would excite the green quantum dots contained therein to generate a percentage of green light. Such a percentage of green light, after transmitting into the red quantum dot layers 31, is still capable of exciting the red quantum dots contained in the red quantum dot layers 31 to give off red light, and thus, no influence would be caused on the three primary color s of the color filer film.

Figure 11:
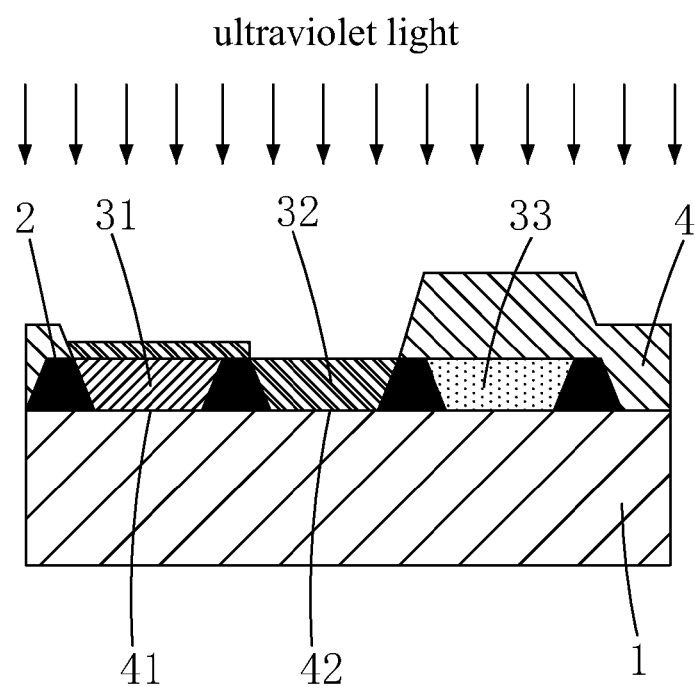
FIGS. 11-13 are schematic views illustrating step 6 of the color filter film manufacturing method according to the present invention.
Figure 12:
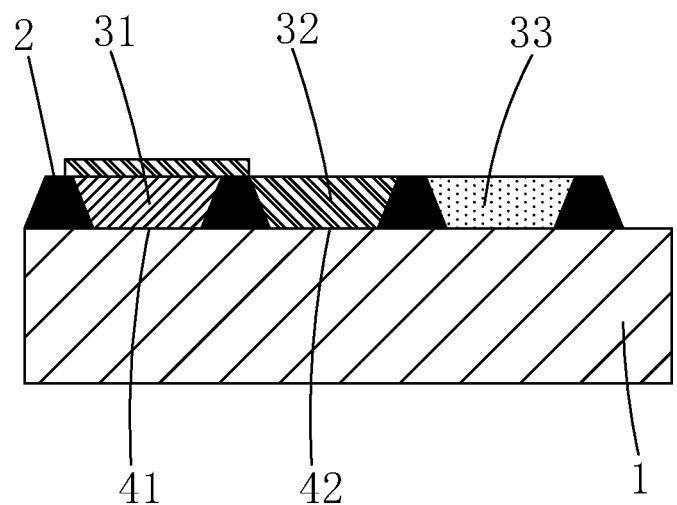
Figure 13:
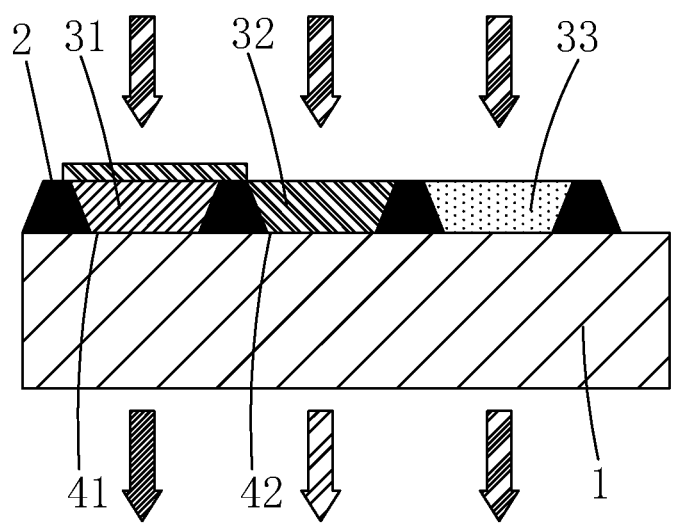

Step 6: as shown in FIGS. 11-13, subjecting a surface of the base plate 1 to ultraviolet irradiation and development to remove a remaining portion of the photoresist layer 4 so as to complete the manufacture of a color filer film.

The red quantum dot layers 31 and the green quantum dot layers 32 are excited by the blue backlight source to respectively give off red light and green light and the blue backlight source transmits directly through the transparent photoresist layers 33 to emit blue light so as to provide three primary colors of red, green, and blue to achieve color displaying.

Optionally, in Step 2, the bottoms of the first recesses 41 are subjected to a hydrophobicity treatment, and the surface of the photoresist layer 4 is hydrophilic; in Step 3, the red quantum dot material 51 is hydrophobic; in Step 4, the bottoms of the second recesses 42 are subjected to a hydrophobicity treatment; and in Step 5, the green quantum dot material 52 is hydrophobic, this being similar to achieve the manufacture of the color filer film according to the present invention.

As shown in FIGS. 12-13, the present invention also provides a color filer film manufactured with the above described manufacturing method, which comprises a base plate 1, a black matrix 2 arranged on the base plate 1, and a plurality of transparent photoresist layers 33, a plurality of red quantum dot layers 31, and a plurality of green quantum dot layers 32 arranged on the base plate 1 and are spaced from each other by the black matrix 2, wherein the red quantum dot layers 31 are formed of a material comprising a mixture of red quantum dots and a paste; and the green quantum dot layers 32 are formed of a material comprising a mixture of green quantum dots and a paste.

The color filer film is operable in combination with a blue backlight source such that the red quantum dot layers 31 and the green quantum dot layers 32 are excitable by the blue backlight source to respectively give off red light and green light, and the blue backlight source is allowed to directly transmit through the transparent photoresist layers 33 to give off blue light thereby providing three primary colors of red, green, and blue to achieve color displaying.

The color filer film of the present invention is applicable to organic light-emitting diode (OLED) and liquid crystal display (LCD) display panels.

In summary, the present invention provides a color filter film manufacturing method, which comprises forming first and second recesses respectively in red and green sub-pixel zones and subjecting bottoms thereof to a treatment for hydrophilicity/hydrophobicity. The difference of hydrophilicity/hydrophobicity between the bottoms of the first and second recesses and a surface of the photoresist layer, in combination with altitude differences, makes the red and green quantum dot materials to respectively form red and green quantum dot layers in the first and second recesses through autonomous flowing. The red and green quantum dot layers are excited by blue backlight source to respectively emit red light and green light, while the blue backlight source directly transmits through the transparent photoresist layers to give off blue light thereby providing three primary colors of red, green, and blue to achieve color displaying. The method increases utilization of quantum dots and the effect of autonomous flowing of the quantum dot paste is better for higher resolution and denser arrangement of pixels, and thus, making it better suitable for manufacture of high-resolution panels than ink-jet printing techniques. The color filer film of the present invention provides an excellent effect of color displaying and high resolution.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A color filter film manufacturing method, comprising the following steps:
   (1) providing a base plate and forming a black matrix on the base plate such that the black matrix defines and circumferentially surrounds a plurality of red sub-pixel zones, a plurality of green sub-pixel zones, and a plurality of blue sub-pixel zones on the base plate; and forming transparent photoresist layers in the blue sub-pixel zones;
   (2) coating a photoresist layer on the base plate, the black matrix, and the transparent photoresist layers and forming first recesses in the photoresist layer to correspond to the red sub-pixel zones; and subjecting bottoms of the first recesses to a treatment for hydrophilicity/hydrophobicity so as to be opposite to hydrophilicity/hydrophobicity of a surface of the photoresist layer;
   (3) coating a red quantum dot material on the photoresist layer with the red quantum dot material having hydrophilicity/hydrophobicity consistent with hydrophilicity/hydrophobicity of the bottoms of the first recesses to allow the red quantum dot material to autonomously flow from the surface of the photoresist layer to the bottoms of the first recesses and then allowing the red quantum dot material to cure so as to form red quantum dot layers in the red sub-pixel zones;
   (4) forming second recesses in the photoresist layer to correspond to the green sub-pixel zones and subjecting bottoms of the second recesses to a treatment for hydrophilicity/hydrophobicity so as to be opposite to hydrophilicity/hydrophobicity of the surface of the photoresist layer;
   (5) coating a green quantum dot material on the photoresist layer with the green quantum dot material having hydrophilicity/hydrophobicity consistent with hydrophilicity/hydrophobicity of the bottoms of the second recesses to allow the green quantum dot material to autonomously flow from the surface of the photoresist layer to the bottoms of the second recesses and then allowing the green quantum dot material to cure so as to form green quantum dot layers in the green sub-pixel zones; and (6) subjecting a surface of the base plate to ultraviolet irradiation and development to remove a remaining portion of the photoresist layer so as to complete the manufacture of a color filer film;

wherein the red quantum dot layers and the green quantum dot layers are excited by the blue backlight source to respectively give off red light and green light and the blue backlight source transmits directly through the transparent photoresist layers to emit blue light so as to provide three primary colors of red, green, and blue to achieve color displaying.

2. The color filter film manufacturing method as claimed in claim 1, wherein in step (1), the black matrix is formed by coating a black matrix material on the base plate and applying exposure and development operations thereto and the black matrix material comprises negative photoresist and a black light-shielding material.

3. The color filter film manufacturing method as claimed in claim 1, wherein in step (2), the photoresist layer comprises positive photoresist.

4. The color filter film manufacturing method as claimed in claim 1, wherein in step (2), a first mask is used to subject portions of the photoresist layer within the red sub-pixel zones to ultraviolet irradiation and development so as to form the first recesses; and in step (4), a second mask is used to subject portions of the photoresist layer within the green sub-pixel zones to ultraviolet irradiation and development so as to form the second recesses.

5. The color filter film manufacturing method as claimed in claim 1, wherein in step (3) and step (5), a thermal process is applied to have the red quantum dot material and the green quantum dot material cured.

6. The color filter film manufacturing method as claimed in claim 5, wherein the thermal process is conducted at a temperature of 60° C.-100° C.

7. The color filter film manufacturing method as claimed in claim 1, wherein in step (2), the bottoms of the first recesses are subjected to a hydrophilicity treatment and the surface of the photoresist layer is hydrophobic; in step (3), the red quantum dot material is hydrophilic; in step (4), the bottoms of the second recesses are subjected to a hydrophilicity treatment; and in step (5), the green quantum dot material is hydrophilic.

8. The color filter film manufacturing method as claimed in claim 1, wherein in step (2), the bottoms of the first recesses are subjected to a hydrophobicity treatment and the surface of the photoresist is hydrophilic; in step (3), the red quantum dot material is hydrophobic; in step (4), the bottoms of the second recesses are subjected to a hydrophobicity treatment; and in step (5), the green quantum dot material is hydrophobic.

9. The color filter film manufacturing method as claimed in claim 1, wherein the base plate comprises a glass plate.

10. A color filter film manufacturing method, comprising the following steps:

(1) providing a base plate and forming a black matrix on the base plate such that the black matrix defines and circumferentially surrounds a plurality of red sub-pixel zones, a plurality of green sub-pixel zones, and a plurality of blue sub-pixel zones on the base plate; and forming transparent photoresist layers in the blue sub-pixel zones;

(2) coating a photoresist layer on the base plate, the black matrix, and the transparent photoresist layers and forming first recesses in the photoresist layer to correspond to the red sub-pixel zones; and subjecting bottoms of the first recesses to a treatment for hydrophilicity/hydrophobicity so as to be opposite to hydrophilicity/hydrophobicity of a surface of the photoresist layer;

(3) coating a red quantum dot material on the photoresist layer with the red quantum dot material having hydrophilicity/hydrophobicity consistent with hydrophilicity/hydrophobicity of the bottoms of the first recesses to allow the red quantum dot material to autonomously flow from the surface of the photoresist layer to the bottoms of the first recesses and then allowing the red quantum dot material to cure so as to form red quantum dot layers in the red sub-pixel zones;

(4) forming second recesses in the photoresist layer to correspond to the green sub-pixel zones and subjecting bottoms of the second recesses to a treatment for hydrophilicity/hydrophobicity so as to be opposite to hydrophilicity/hydrophobicity of the surface of the photoresist layer;

(5) coating a green quantum dot material on the photoresist layer with the green quantum dot material having hydrophilicity/hydrophobicity consistent with hydrophilicity/hydrophobicity of the bottoms of the second recesses to allow the green quantum dot material to autonomously flow from the surface of the photoresist layer to the bottoms of the second recesses and then allowing the green quantum dot material to cure so as to form green quantum dot layers in the green sub-pixel zones; and (6) subjecting a surface of the base plate to ultraviolet irradiation and development to remove a remaining portion of the photoresist layer so as to complete the manufacture of a color filer film;

wherein the red quantum dot layers and the green quantum dot layers are excited by the blue backlight source to respectively give off red light and green light and the blue backlight source transmits directly through the transparent photoresist layers to emit blue light so as to provide three primary colors of red, green, and blue to achieve color displaying;

wherein in step (1), the black matrix is formed by coating a black matrix material on the base plate and applying exposure and development operations thereto and the black matrix material comprises negative photoresist and a black light-shielding material;

wherein in step (2), the photoresist layer comprises positive photoresist;

wherein in step (2), a first mask is used to subject portions of the photoresist layer within the red sub-pixel zones to ultraviolet irradiation and development so as to form the first recesses; and in step (4), a second mask is used to subject portions of the photoresist layer within the green sub-pixel zones to ultraviolet irradiation and development so as to form the second recesses;

wherein in step (3) and step (5), a thermal process is applied to have the red quantum dot material and the green quantum dot material cured; and wherein the base plate comprises a glass plate.

11. The color filter film manufacturing method as claimed in claim 10, wherein the thermal process is conducted at a temperature of 60° C.-100° C.

12. The color filter film manufacturing method as claimed in claim 10, wherein in step (2), the bottoms of the first recesses are subjected to a hydrophilicity treatment and the surface of the photoresist layer is hydrophobic; in step (3), the red quantum dot material is hydrophilic; in step (4), the bottoms of the second recesses are subjected to a hydrophilicity treatment; and in step (5), the green quantum dot material is hydrophilic.

13. The color filter film manufacturing method as claimed in claim 10, wherein in step (2), the bottoms of the first recesses are subjected to a hydrophobicity treatment and the surface of the photoresist is hydrophilic; in step (3), the red quantum dot material is hydrophobic; in step (4), the bottoms of the second recesses are subjected to a hydrophobicity treatment; and in step (5), the green quantum dot material is hydrophobic.

* * * * *